(12) United States Patent
Kontani

(10) Patent No.: US 7,842,529 B2
(45) Date of Patent: Nov. 30, 2010

(54) METHOD OF MANUFACTURING NITRIDE SEMICONDUCTOR LIGHT EMITTING ELEMENT INCLUDING FORMING SCRIBE LINES SANDWICHING AND REMOVING HIGH DENSITY DISLOCATION SECTIONS

(75) Inventor: Katsunori Kontani, Tottori (JP)

(73) Assignees: Tottori Sanyo Electric Co., Ltd., Tottori-Shi (JP); Sanyo Electric Co., Ltd., Moriguchi-Shi (JP)

( * ) Notice: Subject to any disclaimer, the term of this patent is extended or adjusted under 35 U.S.C. 154(b) by 277 days.

(21) Appl. No.: 11/915,493

(22) PCT Filed: May 15, 2006

(86) PCT No.: PCT/JP2006/309680

§ 371 (c)(1),
(2), (4) Date: Nov. 26, 2007

(87) PCT Pub. No.: WO2006/126414

PCT Pub. Date: Nov. 30, 2006

(65) Prior Publication Data

US 2009/0087934 A1 Apr. 2, 2009

(30) Foreign Application Priority Data

May 25, 2005 (JP) .............................. 2005-152364

(51) Int. Cl.
*H01L 21/00* (2006.01)
*H01L 21/46* (2006.01)
*H01L 21/78* (2006.01)
*H01L 21/301* (2006.01)

(52) U.S. Cl. ............................ 438/33; 438/36; 438/462
(58) Field of Classification Search .................. 438/33, 438/36, 462; 257/E33.023
See application file for complete search history.

(56) References Cited

FOREIGN PATENT DOCUMENTS

| JP | 09167858 | * | 6/1997 |
| JP | 2001-102307 A | | 4/2001 |

(Continued)

OTHER PUBLICATIONS

International Search Report of PCT/JP2006/309680, date of mailing Aug. 1, 2006.

*Primary Examiner*—William M. Brewster
(74) *Attorney, Agent, or Firm*—Westerman, Hattori, Daniels & Adrian, LLP

(57) ABSTRACT

In a method for manufacturing a III-V nitride compound semiconductor light emitting element, light emitting element regions (21) are formed in a low dislocation region on the III-V nitride compound semiconductor substrate wherein high density dislocation sections (22) and low dislocation regions are alternately arranged repeatedly, so that stripe-shaped light emitting regions are in parallel to the direction wherein the high density dislocation sections (22) extend, and then the substrate is broken, after making two scribe lines (23) to have the high density dislocation section (22) in between, on a plane (25) on the opposite side to a plane (24) whereupon the element regions (21) are formed. Thus, chips are separated and the high density dislocation sections (22) can be removed. The pitch of the two scribe lines is preferably 100 µm or more. Thus, the method for manufacturing the III-V nitride compound semiconductor light emitting element by which the high density dislocation section can be surely removed without generating chipping or the like in the outer shape and junction down mounting/flip chip mounting can be performed is provided.

4 Claims, 8 Drawing Sheets

FOREIGN PATENT DOCUMENTS

| | | |
|---|---|---|
| JP | 2001-210598 A | 8/2001 |
| JP | 2003-124572 A | 4/2003 |
| JP | 2004-128520 A | 4/2004 |
| JP | 2004-260152 * | 9/2004 |
| JP | 2004-260152 A | 9/2004 |

* cited by examiner

FIG. 2
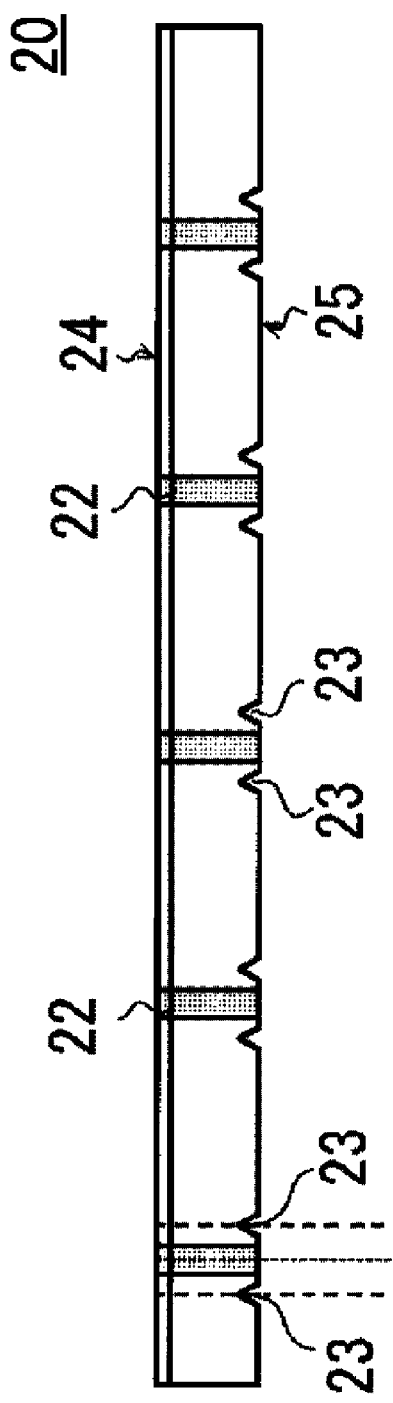
FIG. 2A
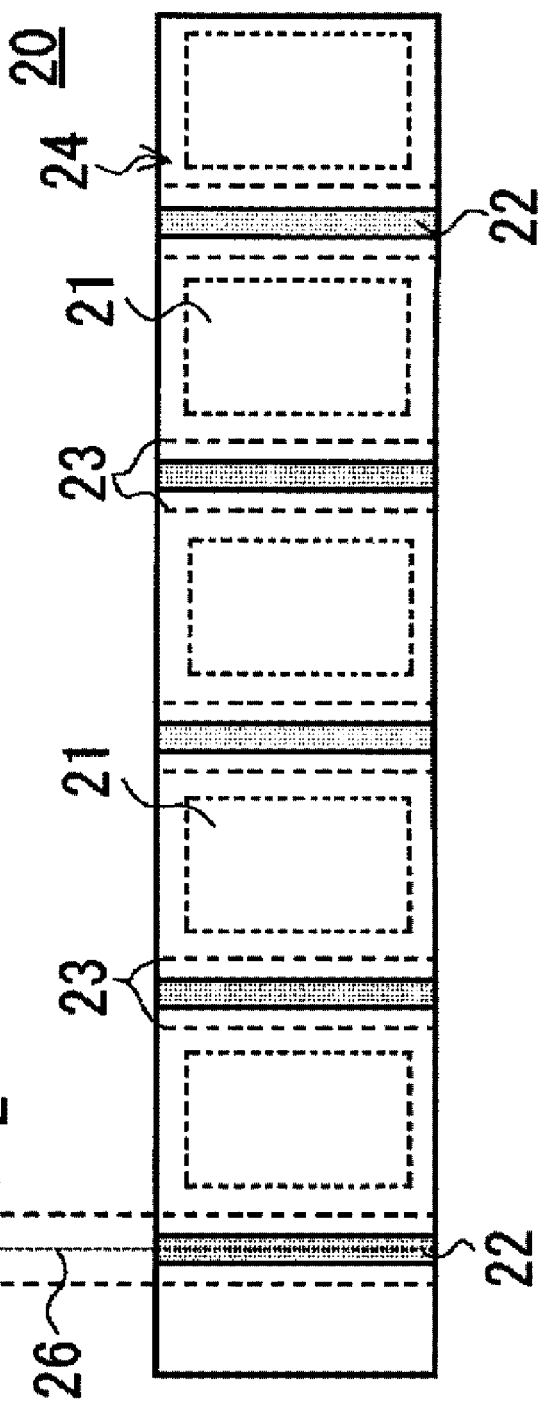
FIG. 2B

FIG.8
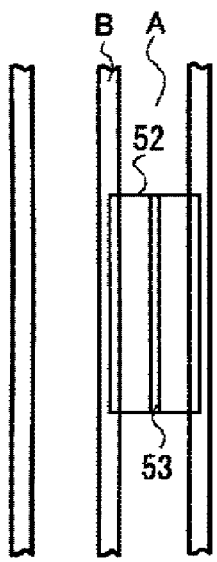
FIG.8A
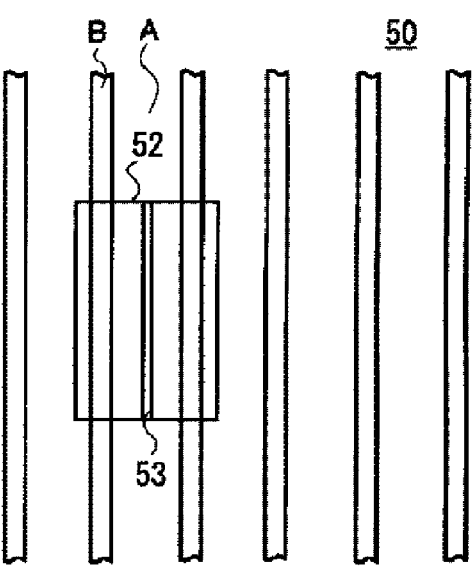
FIG.8B
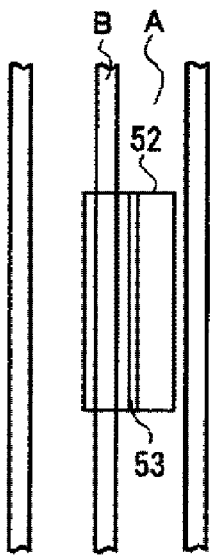
FIG.8C
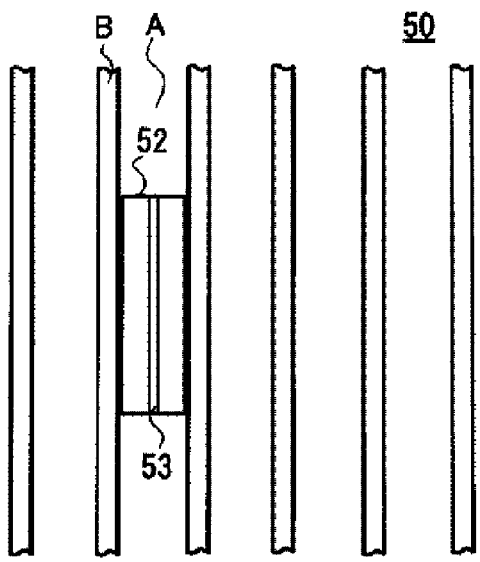
FIG.8D

METHOD OF MANUFACTURING NITRIDE SEMICONDUCTOR LIGHT EMITTING ELEMENT INCLUDING FORMING SCRIBE LINES SANDWICHING AND REMOVING HIGH DENSITY DISLOCATION SECTIONS

TECHNICAL FIELD

The present invention relates to a method of manufacturing a gallium nitride GaN-based compound semiconductor light emitting diode (LED), a compound semiconductor laser element, or another nitride semiconductor light emitting element. Particularly, this invention relates to a method of manufacturing a GaN-based nitride semiconductor light emitting element that allows for junction-down mounting or flip-chip mounting in which the high density dislocation sections are removed, and that can emit short-wavelength blue-violet light.

BACKGROUND ART

In recent years, III-V nitride compound semiconductors have been mainly used in blue LEDs and blue-violet semiconductor lasers. III-V nitride compound semiconductors are grown on an ordinary sapphire substrate or SiC substrate using MOCVD (Metal Organic Chemical Vapor Deposition), MBE (Molecular Beam Epitaxy), HVPE (Hydride Vapor Phase Epitaxy), or another crystal growth method because it is difficult to obtain a low-defect GaN substrate or another III-V nitride compound semiconductor substrate.

The difference in the lattice constants between the sapphire substrate and the GaN-based semiconductor layer is considerable in a nitride-based semiconductor element composed of a GaN-based compound semiconductor layer on a sapphire substrate, for example. For this reason, the GaN-based semiconductor layer formed on a sapphire substrate contains a large number of dislocations, and the crystallinity is reduced. It is therefore difficult to achieve good element characteristics in a III-V nitride compound semiconductor element in which a sapphire substrate or the like is used. There is therefore a need for a substrate of the same quality as a GaN substrate that has few crystal defects in order to manufacture a III-V nitride compound semiconductor element.

A method of manufacturing a single-crystal GaN substrate is disclosed in Patent Document 1 noted below as a III-V nitride compound semiconductor substrate that solves such problems, wherein the growth surface of vapor phase growth is endowed with a 3-D facet structure, and dislocations are reduced by growing the crystal so that the facet structure is not embedded. This method of manufacturing a GaN substrate reduces threading dislocations in other locations by concentrating the threading dislocations in a region in the grown layer. Therefore, low density dislocation regions and high density dislocation sections are both present in the single-crystal GaN substrate. In particular, high density dislocation sections occur at random, and the position where these sections occur cannot be controlled. Accordingly, the formation of high density dislocation sections in light emitting regions cannot be avoided, and there is therefore a problem in that the reliability and light emitting characteristics of a nitride semiconductor light emitting element are liable to be compromised.

On the other hand, the invention of a method of manufacturing a III-V nitride compound semiconductor substrate is disclosed in Patent Document 2 noted below as a solution to the problems of the invention of a method of manufacturing a III-V nitride compound semiconductor substrate disclosed in Patent Document 1, wherein the position of the high density dislocation sections generated in the low density dislocation regions is controlled, a substrate in which the high density dislocation sections are regularly, e.g., periodically arranged in the low density dislocation regions can be obtained, and an arrangement pattern of high density dislocation sections can be freely modified. The method of manufacturing a III-V nitride compound semiconductor substrate disclosed in Patent Document 2 noted below is one in which a crystal is grown having an inclined surface composed of a facet plane in the same manner as the invention disclosed in Patent Document 1 noted below, and dislocations are propagated and made to concentrate in prescribed positions by maintaining and growing the inclined surface composed of the facet plane.

Following is a specific method of manufacturing a GaN substrate 50 as a III-V nitride compound semiconductor substrate disclosed in Patent Document 2. First, a seed composed of, e.g., an SiO2 film is formed on a base substrate using a sapphire substrate, a GaN substrate, or another base substrate. The seed is formed in an arrangement that corresponds to the arrangement of dotted high density dislocation sections B, such as the dotted configuration shown in FIG. 5 or 6, for example, or an arrangement that corresponds to the arrangement of striped high density dislocation sections B shown in FIG. 7. A thick film of GaN is then grown by hydride vapor phase epitaxy (HVPE), for example. A facet plane that corresponds to the pattern shape of the seed is formed on the surface of the GaN thick film layer after growth. Pits composed of facet planes such as those shown in FIG. 5 or 6 are regularly formed when the seed has a dotted pattern. On the other hand, a prism facet plane such as that shown in FIG. 7 is formed when the seed has a striped pattern. The base substrate is then removed and the GaN thick film layer is ground and polished to flatten the surface. The GaN substrate 50 can thereby be manufactured.

A GaN substrate 50 manufactured in this manner is a substrate in which the C plane is the main surface, the dotted or striped high density dislocation sections B having a prescribed size are regularly formed, and the single-crystal regions other than the high density dislocation sections B, i.e., regions A, have a lower dislocation density than the high density dislocation sections B. In view of this fact, it is possible to dispose the element regions in an arrangement in which the effect of the high density dislocation sections B that have a large number of defects can be intentionally avoided using the GaN substrate 50 by adopting the following.

(1) The size of the element is designed to conform to the period in which the high density dislocation sections B are present;

(2) the arrangement of element regions on the substrate is determined so that the element regions are essentially not formed in the high density dislocation sections B; and (3) the positions of the active regions in the element are designed so that the active regions inside the element are not formed in the high density dislocation sections B.

In addition, in the particular case of a semiconductor laser element, the element regions and the element structures are designed so that the end face of a resonator of a light emitting area is not formed in the high density dislocation sections B. For example, element regions 52 (sections enclosed by a thick solid line) are demarcated in a shape and arrangement such as those shown in FIGS. 8A to 8D, and a laser stripe 53 is demarcated adjacent to the center when the striped high density dislocation sections B are formed in the manner shown in FIG. 7.

A GaN-based semiconductor layer that forms a laser structure is grown on the GaN substrate 60; laser stripe formation, electrode formation, and other required processes are carried out to form a laser structure; and the GaN substrate 50 on which the laser structure is formed is thereafter scribed along the contour lines of the element regions 52 described above, whereby individual GaN-based semiconductor laser chips are separated. In this case, the effect of the high density dislocation sections B can be prevented from extending to the light emitting regions because the high density dislocation sections B are not formed on the laser stripe 53. Therefore, a highly reliable GaN-based semiconductor laser element having good light emitting characteristics can be obtained.

Disclosed in Patent Document 3 noted below is a method of manufacturing a III-V nitride compound semiconductor light emitting element in which light emitting element regions are formed so that stripe-shaped light emitting regions are made parallel to the direction in which the high density dislocation sections extend in the low density dislocation regions on the III-V nitride compound semiconductor substrate in which the high density dislocation sections are repeatedly arranged while alternating with the low density dislocation regions, two scribe lines are subsequently formed in positions of about 10 μm from the center line between adjacent elements on a surface on which the light emitting element regions are formed, and the substrate is then broken apart, whereby chip separation is performed and the high density dislocation sections are removed.

[Patent Reference 1]: Japanese Laid-open Patent Application No. 2001-102307

[Patent Reference 2]: Japanese Laid-open Patent Application No. 2003-124572 (Claims, paragraph nos. 0231 to 0256, 0274 to 0289, FIGS. 6 to 8, and FIGS. 23 to 36)

[Patent Reference 3]: Japanese Laid-open Patent Application No. 2004-260152 (Paragraph nos. 0065 to 0070, and FIGS. 13 to 14)

DISCLOSURE OF THE INVENTION

Problems the Invention is Intended to Solve

On the other hand, improvement of heat radiation characteristics must be given priority in order to extend the life and increase the output of such a III-V nitride compound semiconductor light emitting element. The improvement of heat radiation characteristics is generally achieved by junction-down mounting or flip-chip mounting in which the active layer of the III-V nitride compound semiconductor light emitting element is mounted near a heat radiation mounter. However, it is difficult to perform junction-down mounting or flip-chip-mounting because electric current leaks from the high density dislocation sections when the substrate and the III-V nitride compound semiconductor light emitting element formed on the substrate have high density dislocation sections. The high density dislocation sections must be reliably removed without damaging the III-V nitride compound semiconductor light emitting element in order to be able to perform such junction-down mounting or flip-chip mounting. Conventionally, a method is adopted in which scribe lines are formed in the high density dislocation sections, and the chips are broken apart and separated in order to remove the high density dislocation sections present in the substrate and in the III-V nitride compound semiconductor light emitting element formed on the substrate. With this method, however, there are problems in that the removal of high density dislocation sections is unreliable and cracking often occurs in the external configuration of the III-V nitride compound semiconductor light emitting element.

Patent Document 2 noted below discloses the formation (see FIGS. 8A to 8C) of laser stripes of a III-V nitride compound semiconductor light emitting element solely in regions devoid of high density dislocation sections, and the formation (see FIG. 8D) of a III-V nitride compound semiconductor light emitting element solely in regions devoid of high density dislocation sections, but there is no disclosure concerning a method of efficiently removing high density dislocation sections.

In accordance with the method of manufacturing a III-V nitride compound semiconductor light emitting element disclosed in Patent Document 3 described above, the breaking pad must be brought into contact with the surface on the side of the light emitting element regions, and the breaking blade must be brought into contact with the surface on the opposite side from the surface on the side of the light emitting element regions when the chip separation is performed and the high density dislocation sections are removed with good efficiency. Therefore, there are problems in that there are cases in which element separation and the removal of high density dislocation sections cannot be achieved when performed so as to avoid damage to the light emitting element regions, and many chips result in which the removal of high density dislocation sections is incomplete.

In view of the above, and as a result of thoroughgoing research into the structure of the III-V nitride compound semiconductor light emitting element disclosed in Patent Documents 2 and 3 described above, the inventors perfected the present invention having discovered that high density dislocation sections can be reliably removed without the occurrence of cracking or the like in the external configuration of a III-V nitride compound semiconductor light emitting element by optimizing the choice of the surface and the pitch of scribe lines that sandwich the high density dislocation sections.

Specifically, an object of the present invention is to provide a method of manufacturing a III-V nitride compound semiconductor light emitting element that allows high density dislocation sections to be reliably removed without producing cracking or the like in the external configuration of the III-V nitride compound semiconductor light emitting element by optimizing the choice of the surface and the pitch of scribe lines that sandwich the high density dislocation sections during the manufacture of a III-V nitride compound semiconductor light emitting element, and that thereby also allows for junction-down mounting or flip-chip mounting.

Means for Solving the Abovementioned Problems

The above-described objects of the present invention can be achieved using the following method. In other words, the method of manufacturing a III-V nitride compound semiconductor light emitting element according to a first aspect is characterized in that regions of a III-V nitride compound semiconductor light emitting element are formed in a low density dislocation region on a III-V nitride compound semiconductor substrate in which high density dislocation sections are repeatedly arranged while alternating with the low density dislocation regions so that stripe-shaped light emitting regions are made parallel to the direction in which the high density dislocation sections extend; and two scribe lines are subsequently formed so as to sandwich the high density dislocation sections on the surface of the opposite side from the surface on which the light emitting element regions are formed, and breaking is then performed to thereby separate chips and remove the high density dislocation sections.

In the method of manufacturing a III-V nitride compound semiconductor element according to a second aspect, the break plane for performing the chip separation and removing high density dislocation sections is preferably a surface on which the light emitting element regions are formed.

In the method of manufacturing a III-V nitride compound semiconductor light emitting element according to a third aspect, the middle of the two scribe lines is preferably positioned at the center of the high density dislocation sections.

In the method of manufacturing a III-V nitride compound semiconductor light emitting element according to a fourth aspect, the pitch of the two scribe lines is preferably greater than the width of the high density dislocation sections.

In the method of manufacturing a III-V nitride compound semiconductor light emitting element according to a fifth aspect, the pitch of the two scribe lines is preferably 100 μm or more.

In the method of manufacturing a III-V nitride compound semiconductor light emitting element according to a sixth aspect, the spacing of the breaking blade pads during the chip separation is preferably less than the pitch of the scribe lines.

Effect of the Invention

The present invention adopts a method of manufacturing such as that described above, whereby the excellent effects described below are achieved. Specifically, in accordance with the present invention, light emitting element regions are formed so that the stripe-shaped light emitting regions are parallel to the direction in which the high density dislocation sections extend in the low density dislocation regions. Therefore, a highly reliable III-V nitride compound semiconductor light emitting element having good characteristics can be obtained because the high density dislocation sections no longer affect the light emitting regions. The resulting III-V nitride compound semiconductor light emitting element has less cracking when chips separation is performed and high density dislocation sections are removed because two scribe lines are formed so as to sandwich the high density dislocation sections on the surface on the opposite side from the surface on which the light emitting element regions are disposed, and the substrate are then broken apart. In addition, electric current leaks are not liable to occur and junction-down mounting or flip-chip mounting can be implemented because high density dislocation sections are removed from the resulting III-V nitride compound semiconductor light emitting element. Therefore, the element can be provided with better heat radiation characteristics, an extended service life, and a higher output.

In the present invention, the break surface in which chip separation is performed and high density dislocation sections are removed is the surface on which the light emitting element regions are formed, and damage is therefore reduced because the light emitting element regions are not brought into contact with the breaking blade and the breaking pad.

In the invention described above, the widths of the high density dislocation sections have variability in the range of about 20 to 30 μm, but since the widths are essentially symmetric from the center of the high density dislocation sections, the manufacturing efficiency of the III-V nitride compound semiconductor light emitting element and the removal efficiency of the high density dislocation sections are improved because the middle of the two scribe lines is positioned at the center of the high density dislocation sections.

In the invention described above, the pitch of the scribe lines is set to be greater than the width of the high density dislocation sections, and a III-V nitride compound semiconductor light emitting element in which the high density dislocation sections are reliably removed can be obtained.

In addition, a margin must be provided to the pitch of the scribe lines during removal of the high density dislocation sections because the widths of the high density dislocation sections have variability in the range of about 20 to 30 μm. Since the pitch of the scribe lines is set to 100 μm or more, essentially 100% of the high density dislocation sections can be removed even if there is variability in the widths of the high density dislocation sections. The upper limit of the pitch of the scribe lines is essentially determined by the chip size because the inherent ridge width of the III-V nitride compound semiconductor light emitting element is about 1 to 2 μm, and there is therefore no critical limit.

In the invention described above, the pad spacing of the breaking blade during chip separation is set to be less than the pitch of the scribe lines, whereby chip separation can be efficiently performed and high density dislocation sections removed, and the generation of cracking in the chip sections can be reduced.

BRIEF DESCRIPTION OF THE DRAWINGS

FIG. 2 is a cross-sectional view (FIG. 2A) and a plan view (FIG. 2B) of a substrate prior to element separation and removal of high density dislocation sections when the GaN blue-violet laser diode element is manufactured in the experimental examples;

FIGS. 8A to 8D are diagrams showing examples in which element regions and laser stripes are demarcated when striped high density dislocation sections B are formed.

KEY TO SYMBOLS

Figure 1:
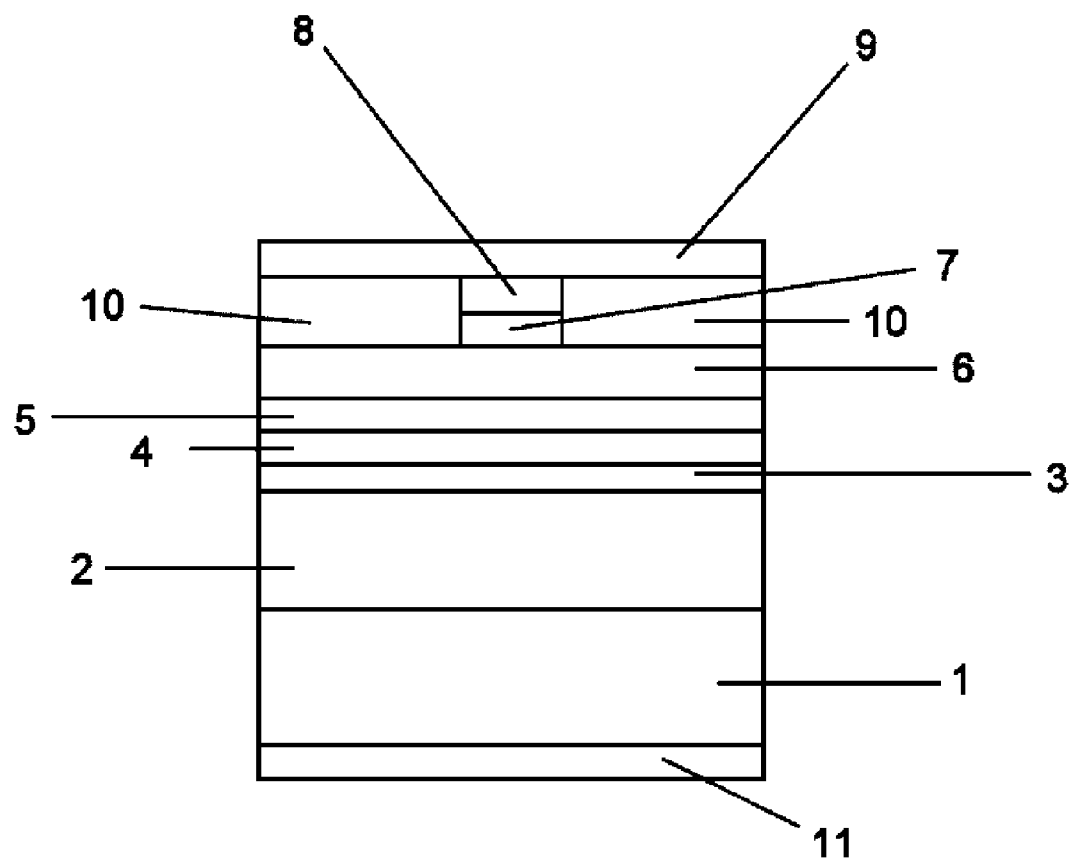
FIG. 1 is a cross-sectional view of a GaN blue-violet laser diode element manufactured in experimental examples.

1 GaN substrate
2 n-Type AlGaN cladding layer
3 Tri-periodic structure (MQW) active layer
4 InGaN light guide layer
5 p-Type AlGaN cap layer
6 p-Type AlGaN cladding layer
7 p-Type GaN contact layer
8 p-Side electrode
9 Pad electrode
10 SiO2 film
11 n-Side electrode
20 Bar substrate
21 GaN blue-violet laser diode element
22 Linear high density dislocation section
23 Scribe line 24 Breaking blade
28, 29 Breaking pads
A Low density dislocation region
B High density dislocation section
L Scribe line pitch
W Pad spacing of breaking blade

BEST MODE FOR CARRYING OUT THE INVENTION

The best mode for carrying out the present invention will be described in detail with reference to experimental examples and the drawings. However, the examples described below exemplify the method of manufacturing a III-V nitride compound semiconductor light emitting element as specific embodiments of the technical concepts of the present invention and are not intended to limit the present invention to the examples. The present invention can be equally applied to various modifications that do not depart from the technical concepts described in the claims.

Figure 3:
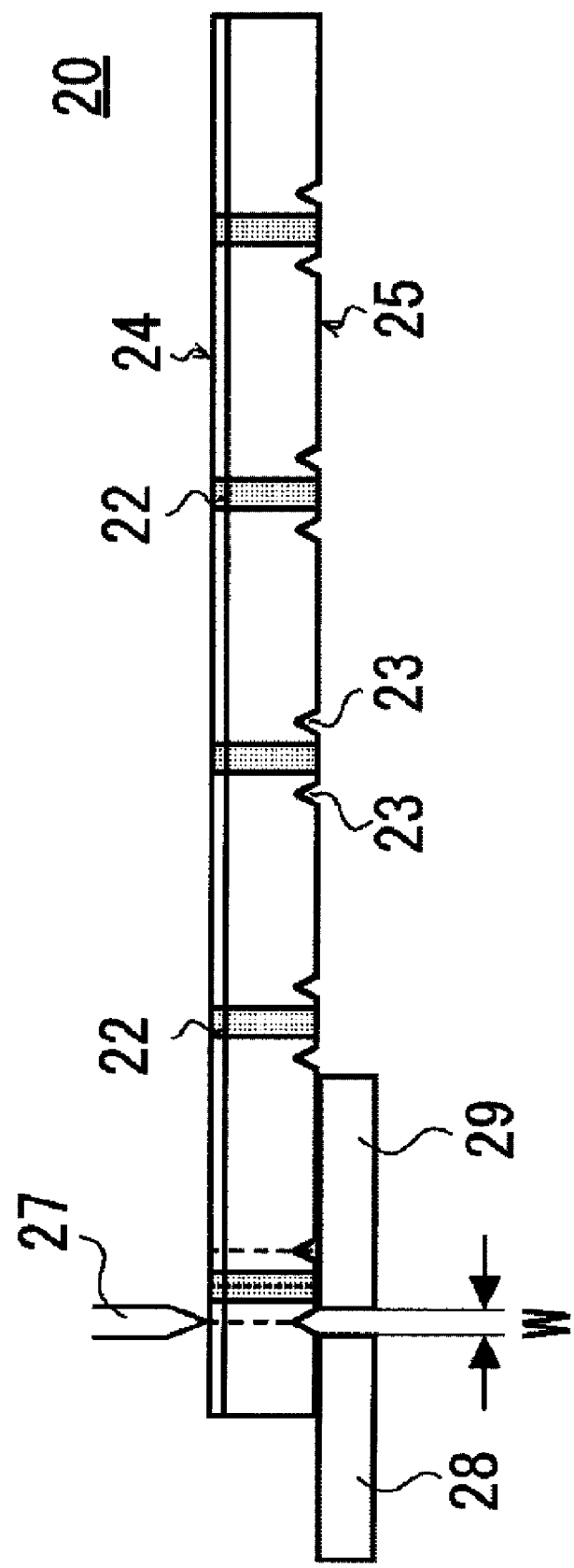
FIG. 3 is a diagram showing the positional relationship between the scribe lines, the breaking blade, and the breaking pad when the chips are separated or when the high density dislocation sections are removed.
Figure 4:
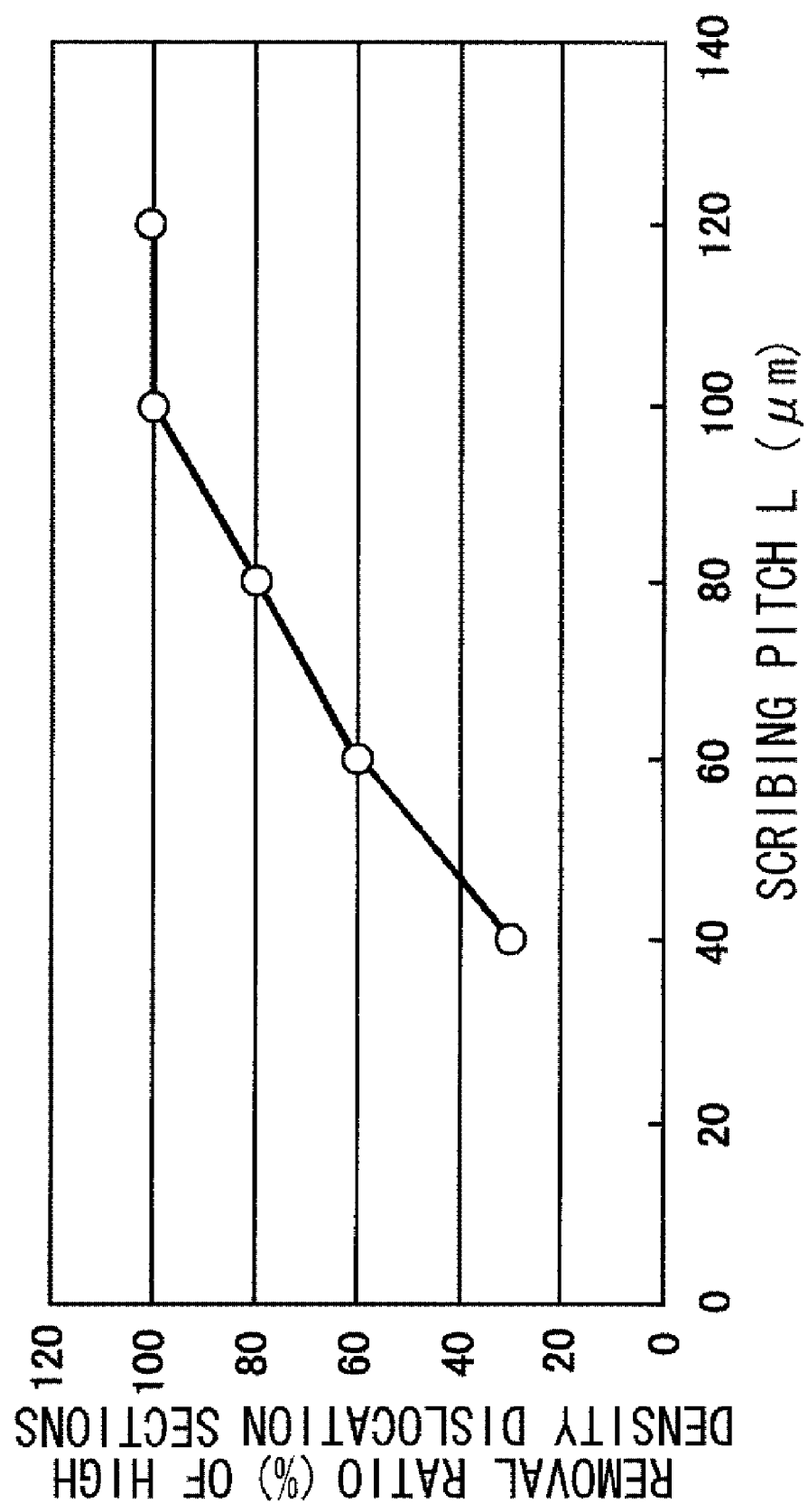
FIG. 4 is a diagram showing the relationship between the scribing pitch L of the substrate shown in FIG. 2 and the removal ratio of high density dislocation sections.
Figure 5:
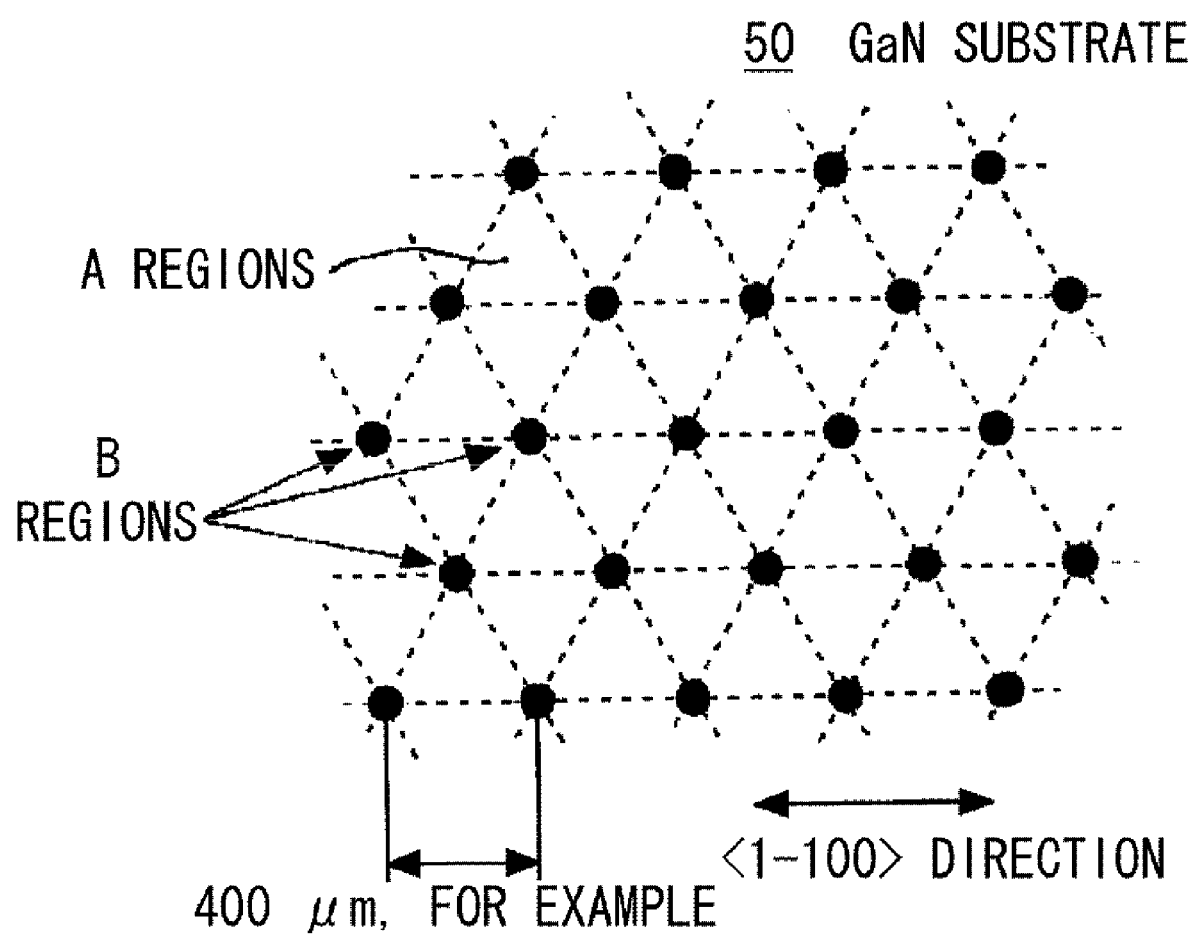
FIG. 5 is a diagram showing an example in which dotted high density dislocation sections B are formed.
Figure 6:
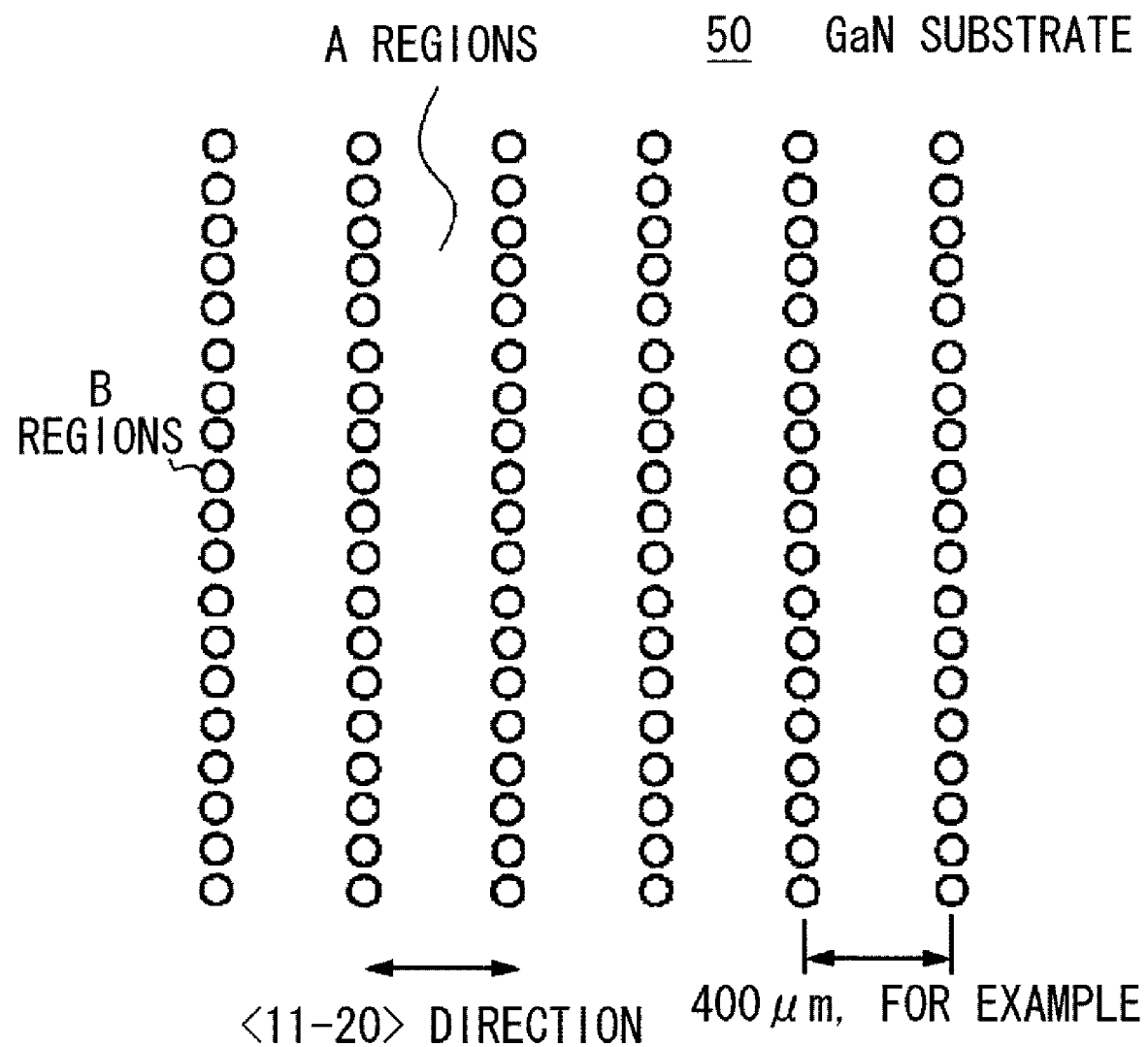
FIG. 6 is a diagram showing another example in which dotted high density dislocation sections B are formed.

FIG. 1 is a cross-sectional view of a GaN blue-violet laser diode element manufactured in the experimental examples. FIG. 2 is a cross-sectional view (FIG. 2A) and a plan view (FIG. 2B) of a substrate prior to element separation and removal of high density dislocation sections when the GaN blue-violet laser diode element is manufactured in the experimental examples. FIG. 3 is a diagram showing the positional relationship between the scribe lines, the breaking blade, and the breaking pad when the chips are separated or when the high density dislocation sections are removed. FIG. 4 is a diagram showing the relationship between the scribing pitch of the substrate shown in FIG. 2 and the removal ratio of the high density dislocation sections.

EXPERIMENTAL EXAMPLE

Figure 7:
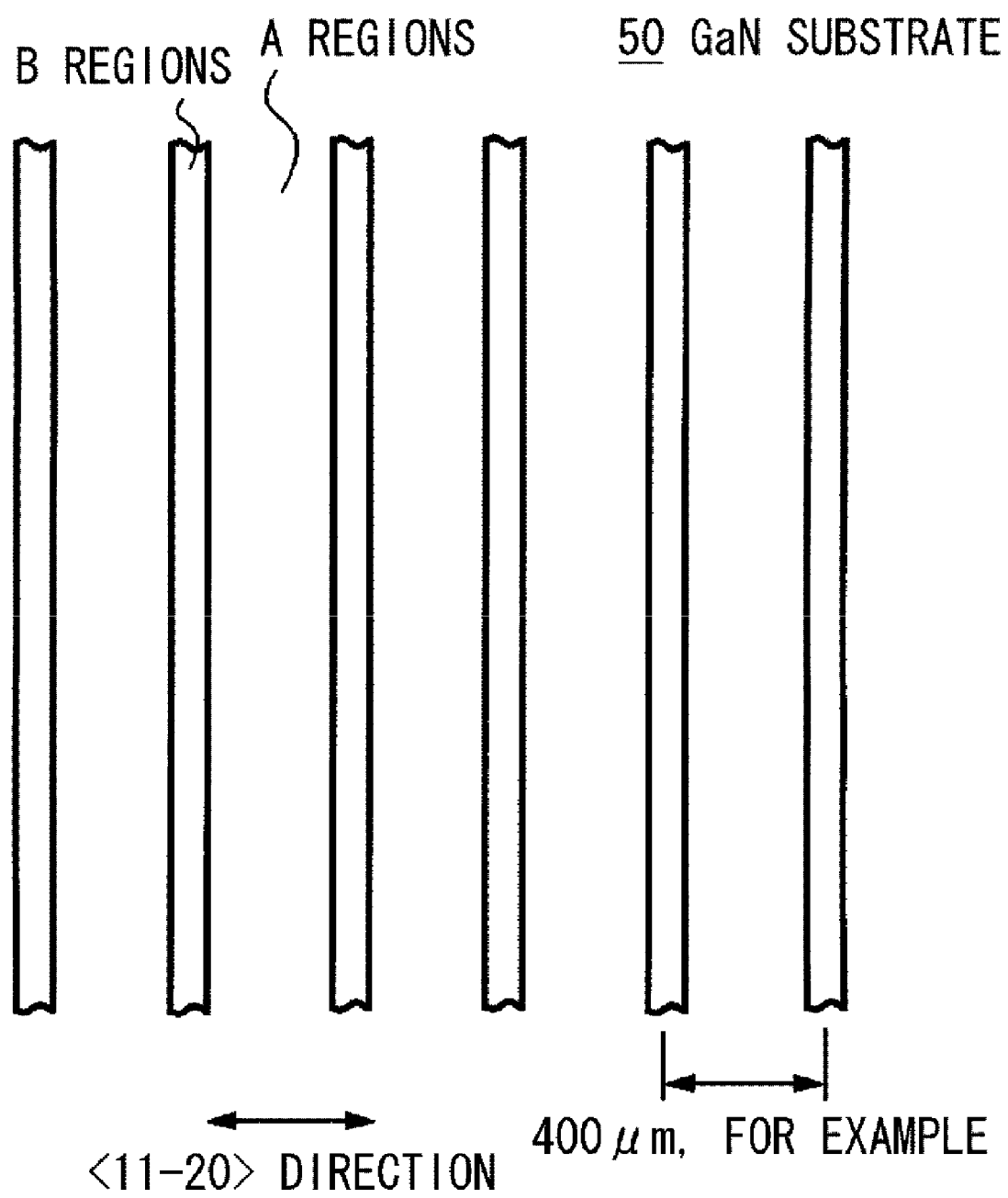
FIG. 7 is a diagram showing an example in which striped high density dislocation sections B are formed.

First, a GaN substrate (see FIG. 7) was prepared in which high density dislocation sections were linearly converged in accordance with the method disclosed in Patent Document 2 described above. The GaN substrate has the C plane as the main surface and is a substrate in which striped high density dislocation sections B are regularly formed in the low density dislocation density regions A at intervals of about 400 μm in the <11-20> direction.

A GaN blue-violet laser diode element was fabricated using the GaN substrate 1 in the manner shown in FIG. 1. First, an n-type AlGaN cladding layer 2 was grown to 1.0 μm by MOCVD (Metal Organic Chemical Vapor Deposition) on the GaN substrate 1. An InGaN well layer, which is part of the tri-periodically structured MQW active layer 3, was then grown to 0.003 μm; a GaN barrier layer, which is another part of the tri-periodically structured MQW active layer 3, was subsequently grown to 0.02 μm; and an InGaN light guide layer 4 was furthermore grown to 0.1 μm.

A p-type AlGaN cap layer 5 was then grown to 0.02 μm, and a p-type AlGaN cladding layer 6 was subsequently grown to 0.5 μm. Lastly, a p-type GaN contact layer 7 was grown to 0.005 μm. Next, the electrode process was carried out in accordance with the following procedure. First, a p-side electrode layer 8 composed of Pt/Pd was formed; a ridge composed of the p-side electrode layer 8 and the p-type GaN contact layer 7, which was a current constricting portion, was formed by dry etching; and a SiO2 film 10 was then formed on the two sides of the ridge by using a CVD apparatus. Next, a pad electrode 9 composed of Ti/Pd/Au was formed, the reverse side of the substrate was polished, the thickness of the wafer was set to about 110 μm, an n-side electrode 11 composed of Al/Pt/Au was ultimately formed, and a wafer on which a plurality of GaN blue-violet laser diode elements was formed was completed.

Next, a bar-shaped substrate 20 in which a plurality of GaN blue-violet laser diode elements was parallelly formed in the manner shown in FIG. 2 was obtained by cleaving the wafer. Next, two scribe lines 23 were formed on the substrate-side surface 25 on the opposite side from the surface 24 on which the GaN blue-violet laser diode elements 21 were formed so as to sandwich the linear high density dislocation sections 22 present between the GaN blue-violet laser diode elements 21, and so as to be symmetric to the center line 26 of the high density dislocation sections; and five types of samples were fabricated in which the pitch L of the scribe lines 23 was 40 μm, 60 μm, 80 μm, 100 μm, and 120 μm. The pitch L of the scribe lines 23 was modified by varying the load from 5 g to 25 g during formation of the scribe lines 23.

Lastly, a bar-shaped substrate 20 having each of the pitches L of the scribe lines was formed; a cleavage apparatus (not shown) was disposed on the substrate-side surface 25 in which the spacing W of the pads 28 and 29 of the breaking blade 27 was constant at 60 μm, as shown in FIG. 3; and the breaking blade 27 was brought into contact from the surface 24 on which the GaN blue-violet laser diode elements 21 were formed, whereby chip separation was performed and the high density dislocation sections 22 were removed to complete the chip. FIG. 4 shows the measurement results of the pitch L of the two scribe lines 23 and the removal ratio of the high density dislocation sections 22 of the completed state of the chip.

According to the results shown in FIG. 4, the removal ratio of the high density dislocation sections was lowest when the pitch L of the scribe lines was 40 μm, the removal ratio of the high density dislocation sections increased as the pitch L of the scribe lines increased, and the removal ratio of the high density dislocation sections was 100% when the pitch L of the scribe lines was 100 μm or more. Therefore, if the pitch L of the scribe lines is 100 μm or more, the high density dislocation sections 22 can be reliably removed even considering variability in the width of the high density dislocation sections 22.

When the spacing W of the pads 28 and 29 of the breaking blade 27 during chip separation was the same or greater than the pitch L of the scribe lines, i.e., 60 μm and 40 μm, cracking was observed in the chip section, and cases occurred in which the chip section could not be separated or the high density dislocation sections 22 could not be removed. Therefore, the spacing W of the pads 28 and 29 of the breaking blade 27 during chip separation or removal of the high density dislocation sections is set to be less than the pitch L of the scribe lines, whereby chip separation or removal of the high density dislocation sections can be efficiently performed, and the occurrence of cracking in the chip section can be reduced.

The invention claimed is:

1. A method of manufacturing a III-V nitride compound semiconductor light emitting element, characterized in that regions of a III-V nitride compound semiconductor light emitting element are formed in a low density dislocation region on a III-V nitride compound semiconductor substrate in which high density dislocation sections are repeatedly arranged while alternating with said low density dislocation regions so that stripe-shaped light emitting regions are made parallel to the direction in which said high density dislocation sections extend; and two scribe lines are subsequently formed so as to sandwich said high density dislocation sections only on the surface of the opposite side from the surface on which said light emitting element regions are formed, and the pitch of said two scribe lines is 100 μm or more, and breaking is then performed to thereby separate chips and remove said high density dislocation sections.

2. The method of manufacturing a III-V nitride compound semiconductor light emitting element according to claim 1, characterizing in that the break plane for performing said chip separation and removing high density dislocation sections is a surface on which said light emitting element regions are formed.

3. The method of manufacturing a III-V nitride compound semiconductor light emitting element according to claim 1, characterizing in that the middle of said two scribe lines is positioned at the center of said high density dislocation sections.

4. The method of manufacturing a III-V nitride compound semiconductor light emitting element according to any of claims 1 through 3, wherein the spacing of the breaking blade pads during said chip separation is less than the pitch of said scribe lines.

* * * * *